(12) United States Patent
Li et al.

(10) Patent No.: US 11,251,233 B2
(45) Date of Patent: Feb. 15, 2022

(54) ORGANIC LIGHT-EMITTING DIODE DISPLAY SUBSTRATE AND METHOD FOR FABRICATING THE SAME, DISPLAY DEVICE

(71) Applicant: BOE TECHNOLOGY GROUP CO., LTD., Beijing (CN)

(72) Inventors: Wei Li, Beijing (CN); Wei Liu, Beijing (CN); Dini Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/453,096

(22) Filed: Jun. 26, 2019

(65) Prior Publication Data
US 2020/0035754 A1 Jan. 30, 2020

(30) Foreign Application Priority Data
Jul. 27, 2018 (CN) .......................... 201810841550.4

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 51/5218* (2013.01); *H01L 51/5221* (2013.01); *H01L 51/5265* (2013.01); *H01L 51/56* (2013.01)

(58) Field of Classification Search
CPC ............... H01L 27/322; H01L 27/3206; H01L 27/3211; H01L 51/5218; H01L 51/5221; H01L 51/0022; H01L 51/5265
See application file for complete search history.

(56) References Cited

U.S. PATENT DOCUMENTS

| 2005/0225232 A1* | 10/2005 | Boroson | H01L 27/3206 313/504 |
| 2009/0072693 A1* | 3/2009 | Cok | H01L 27/3206 313/110 |
| 2012/0241725 A1* | 9/2012 | Sawabe | H01L 51/5044 257/40 |
| 2015/0060796 A1* | 3/2015 | Kim | H01L 51/006 257/40 |

(Continued)

FOREIGN PATENT DOCUMENTS

| CN | 104900684 A | 9/2015 |
| CN | 106981582 A | 7/2017 |

(Continued)

OTHER PUBLICATIONS

Office Action dated Jun. 3, 2020 for application No. CN201810841550.4 with English translation attached.

*Primary Examiner* — Vongsavanh Sengdara
(74) *Attorney, Agent, or Firm* — Nath, Goldberg & Meyer; Joshua B. Goldberg

(57) ABSTRACT

The present disclosure provides an OLED display substrate including a substrate, a pixel defining layer on the substrate, for defining a plurality of sub-pixel regions having different colors; and cavity length adjusting layers in the sub-pixel regions, wherein the cavity length adjusting layers comprise a conductive ink, and the cavity length adjusting layers have different thicknesses in the sub-pixel regions having different colors.

17 Claims, 4 Drawing Sheets

(56) References Cited

U.S. PATENT DOCUMENTS

2015/0318502 A1* 11/2015 Kanai ................... H01L 51/052
                                                          257/40
2017/0110519 A1*  4/2017 Hsu ..................... H01L 27/3211
2019/0296264 A1*  9/2019 Mathai ................ H01L 51/5088

FOREIGN PATENT DOCUMENTS

CN         107204400 A      9/2017
CN         107275503 A     10/2017

* cited by examiner

ORGANIC LIGHT-EMITTING DIODE DISPLAY SUBSTRATE AND METHOD FOR FABRICATING THE SAME, DISPLAY DEVICE

CROSS-REFERENCE TO RELATED APPLICATION

The present application claims the priority to Chinese Patent Application No. 201810841550.4, entitled "Organic Light-Emitting Diode Display Substrate and Method For Fabricating the Same, Display Device", filed on Jul. 27, 2018, the disclosure of which is incorporated by reference herein in its entirety.

TECHNICAL FIELD

The present disclosure relates to the field of display technologies, and in particular, to an organic light-emitting diode display substrate, a method for fabricating the same, and a display device.

BACKGROUND

Organic Light-emitting Diode (OLED) display technology has become a research hotspot in the field of optoelectronic display technology due to its advantages of self-illumination, wide viewing angle, high contrast, low power consumption, high reaction speed, ultra-light weight and thinness, flexible display, foldable screen, temperature adaptation, simple manufacturing process, etc. Full color display is an important indicator to verify whether a display device is competitive in the market, so many full colorization technologies are also applied to OLED display devices and are usually divided into three types based on panel types: individual pixel illumination (such as red, green and blue pixels (RGB)), color conversion and color filter. The color filter technology achieves color display by using a white OLED in conjunction with color filters. In order to improve the color purity of the OLED light source, microcavity structures are generally disposed in an OLED display substrate, that is, optical resonant cavities (i.e., the foregoing microcavity structures) are formed between the anode and the cathode of the OLED. The light emitted by a light emitting layer is emitted out after travelling through an optical resonant cavity, which can perform multi-level reflection, total reflection, diffraction or scattering on the light, so that the light emitted from the cathode can be limited to have a wavelength in a small wavelength range, thereby improving the color purity of the light emitted from the OLED. White light emitted from the cathode is filtered by a color filter to obtain a corresponding pixel color, thereby achieving color display.

SUMMARY

In one aspect of the disclosure, an organic light-emitting diode (OLED) display substrate is provided. According to some embodiments of the present disclosure, the OLED display substrate includes: a substrate, a pixel defining layer on the substrate for defining a plurality of sub-pixel regions having different colors, and cavity length adjusting layers in the sub-pixel regions, wherein the cavity length adjusting layers include a conductive ink, and the cavity length adjusting layers have different thicknesses in the sub-pixel regions having different colors.

According to some embodiments of the present disclosure, the conductive ink includes at least one of a metal nanoparticle, a conductive carbon material and a conductive polymer.

According to some embodiments of the present disclosure, the plurality of sub-pixel regions include a red sub-pixel region, a green sub-pixel region, and a blue sub-pixel region, the cavity length adjusting layer in the red sub-pixel region has a thickness of about 1630 Å to 1730 Å, the cavity length adjusting layer in the green light sub-pixel region has a thickness of about 730 Å to 830 Å, and the cavity length adjusting layer in the blue light sub-pixel region has a thickness of about 1130 Å to 1230 Å.

According to some embodiments of the present disclosure, the conductive ink is nano-silver ink, and the thicknesses of the cavity length adjusting layers in the red sub-pixel region, the green sub-pixel region, and the blue sub-pixel region are about 1680 Å, 780 Å, and 1180 Å, respectively.

According to some embodiments of the present disclosure, the OLED display substrate further includes: an anode layer on the substrate and in the plurality of sub-pixel regions, and the cavity length adjusting layers are on a side of the anode layer away from the substrate.

According to some embodiments of the present disclosure, the anode layer includes a conductive anode layer and a reflective anode layer, the conductive anode layer includes indium tin oxide or indium zinc oxide and has a thickness of about 80 Å, and the reflective anode layer includes silver and has a thickness of about 1000 Å.

According to some embodiments of the present disclosure, the OLED display substrate further includes: a conductive layer on a side of the cavity length adjusting layer away from the substrate, the conductive layer includes indium tin oxide or indium zinc oxide, and has a thickness of about 1100 Å to 1300 Å.

According to some embodiments of the present disclosure, the OLED display substrate further includes: a light emitting layer on a side of the conductive layer away from the cavity length adjusting layer, and a cathode layer on a side of the light emitting layer away from the conductive layer.

In another aspect of the present disclosure, a method for fabricating an OLED display substrate is provided. According to some embodiments of the present disclosure, the method includes: providing a substrate on which a pixel defining layer is disposed, the pixel defining layer defining a plurality of sub-pixel regions having different colors; and applying a conductive ink in the plurality of sub-pixel regions to form cavity length adjusting layers, wherein the cavity length adjusting layers have different thicknesses in the sub-pixel regions having different colors.

According to some embodiments of the present disclosure, the step of applying a conductive ink in the plurality of sub-pixel regions includes applying the conductive ink by printing in the plurality of sub-pixel regions.

According to some embodiments of the present disclosure, the conductive ink includes at least one of a metal nanoparticle, a conductive carbon material and a conductive polymer.

According to some embodiments of the present disclosure, the plurality of sub-pixel regions include a red sub-pixel region, a green sub-pixel region and a blue sub-pixel region, the cavity length adjusting layer in the red sub-pixel region has a thickness of about 1630 Å to 1730 Å, the cavity length adjusting layer in the green sub-pixel region has a thickness of about 730 Å to 830 Å, and the cavity length adjusting layer in the blue sub-pixel region has a thickness of about 1130 Å to 1230 Å.

According to some embodiments of the present disclosure, the conductive ink is nano silver ink, and the thicknesses of the cavity length adjusting layer in the red sub-pixel region, the green sub-pixel region, and the blue sub-pixel region are about 1680 Å, 780 Å, and 1180 Å, respectively.

According to some embodiments of the present disclosure, before the step of applying the conductive ink by printing in the plurality of sub-pixel regions, the method further includes: forming an anode layer in the plurality of sub-pixel regions by sputtering, wherein the cavity length adjusting layer is disposed on a side of the anode layer away from the substrate.

According to some embodiments of the present disclosure, the anode layer includes a conductive anode layer and a reflective anode layer formed in sequence, the conductive anode layer includes indium tin oxide or indium zinc oxide and has a thickness of about 80 Å, the reflective anode layer includes silver and has a thickness of about 1000 Å.

According to some embodiments of the present disclosure, the method further includes: forming a conductive layer on the cavity length adjusting layer.

According to some embodiments of the present disclosure, the conductive layer includes indium tin oxide or indium zinc oxide, and has a uniform thickness in the plurality of sub-pixel regions, the thickness being about 1100 Å to 1300 Å.

According to some embodiments of the present disclosure, after forming the conductive layer, the method further includes: forming a light emitting layer on aside of the conductive layer away from the cavity length adjusting layer by evaporation; and forming a cathode layer on a side of the light emitting layer away from the conductive layer by sputtering.

In another aspect of the present disclosure, an OLED display device is provided. According to some embodiments of the present disclosure, the OLED display device includes an OLED display substrate, the OLED display substrate is the OLED display substrate described above.

According to some embodiments of the present disclosure, the OLED display device further includes: a cover plate having a color filter and a black matrix, wherein the cover plate is opposite to the OLED display substrate, the black matrix is opposite to the pixel defining layer, and the color filter is opposite to the sub-pixel regions.

BRIEF DESCRIPTION OF THE DRAWINGS

The above and/or additional aspects of the present disclosure will become apparent and readily understood from the description of the embodiments in conjunction with the drawings, wherein.

DETAILED DESCRIPTION

Figure 1:
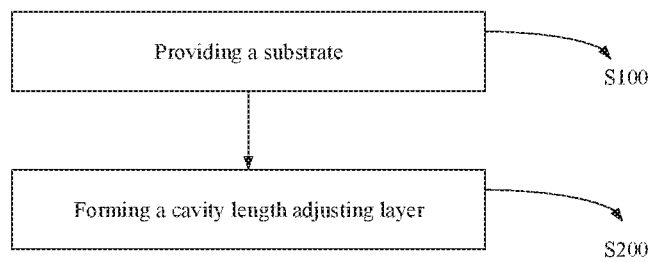
FIG. 1 is a flow chart of a method for fabricating an OLED display substrate according to an embodiment of the present disclosure.

Embodiments of the present disclosure are described in detail below, and examples of the embodiments are illustrated in the drawings, in which the same or similar reference numerals are used to refer to the same or similar elements or elements having the same or similar functions. The embodiments described below with reference to the drawings are only intended to be illustrative, and are not to be construed as limiting the disclosure.

A known method for fabricating microcavity structures with different cavity lengths typically adjusts the cavity lengths of the microcavity structures by controlling a thickness of an ITO layer, which is deposited on the control electrode (anode or cathode) as a cavity length adjusting layer, and may include: depositing an ITO layer having a large thickness first by a process such as sputtering, and then forming cavity length adjusting layers having different thickness in sub-pixel regions having different colors by an etching process. This method has multiple steps and is complicated, that is, every cavity length adjusting layer with a certain thickness is fabricated by multiple steps such as providing a mask, exposing, developing, etching, etc. For example, in a case where cavity length adjusting layers (such as ITO layers) having three different thicknesses are formed in sub-pixel regions of three colors of red, green, and blue, the pre-deposited ITO layer is required to undergo the above etching process for at least three times, which wastes production cost and production time. In addition, since the sputtering device has a limited precision, uniformity of the pre-deposited ITO layer cannot be guaranteed, and thus accuracy and uniformity of the thickness of each cavity length adjusting layer formed subsequently cannot be guaranteed. Furthermore, when ITO is used for forming the cavity length adjusting layer, the cavity length of the formed microcavity structure has a limited adjustment range due to the properties of ITO. When the deposited ITO layer is too thick, ITO is easily crystallized, which may result in residues due to incomplete etching. Accordingly, the cavity length adjusting layer formed by this method has a limited thickness range, it is difficult to form a cavity length adjusting layer having a large thickness, and the cavity length cannot be freely controlled as needed, so that the color purity of the OLED and the display quality of the OLED display substrate can hardly be improved.

An existing OLED with optical resonant cavities has problems that the fabrication process is complicated and the cavity length of the microcavity structure can only be adjusted in a small range. The inventors found through in-depth research that this is mainly due to the restrictions of the material property and the fabrication process of the cavity length adjusting layer in the microcavity structure, and sub-pixel regions having different colors need to be designed to have different thicknesses to improve color purity. Therefore, the cavity length adjusting layers corresponding to the sub-pixel regions having different colors have different thicknesses.

In one aspect of the disclosure, a method for fabricating an OLED display substrate is provided. In the method, a cavity length adjusting layer can be easily formed by applying a conductive ink on a substrate, the thicknesses of the cavity length adjusting layers provided in the sub-pixel regions having different colors can be easily controlled by controlling parameters and the like in the process of applying the conductive ink (for example, forming cavity length adjusting layers with different thicknesses in sub-pixel regions having different colors by printing), and then the cavity lengths of the microcavity structures corresponding to the sub-pixel regions having different colors can be conveniently controlled. Hence, the color purity of each sub-pixel region is high, which facilitates achievement of a high color gamut and improvement of the display quality of the OLED display substrate. Moreover, compared with the method commonly used at present, in which a whole layer of cavity length adjusting layer (such as an ITO layer) is deposited in sub-pixel regions having different colors and then a complicated etching process is performed for multiple times such that cavity length adjusting layers with different thickness correspond to sub-pixel regions having different colors as described above, the method according to the embodiments of the present disclosure is simple to operate, saves production process steps and production cost, and has an improved yield rate. In addition, the cavity length adjusting layer formed according to the embodiments of the present disclosure has a thickness range which is not specially restricted, and the surface thereof has a good flatness, which further improves the use performance of the OLED display substrate. According to an embodiment of the present disclosure, the method for applying the conductive ink on the substrate is not particularly limited, and a conventional patterning process in the art may be employed. Alternatively, the conductive ink may be printed onto the substrate, the printing process is easy to operate, and the thicknesses of the cavity length adjusting layers formed by printing in the sub-pixel regions having different colors can be easily controlled by controlling the dropping amount of the conductive ink during the printing, so that the cavity lengths of microcavity structures corresponding to the sub-pixel regions having different colors can be easily controlled.

According to an embodiment of the present disclosure, referring to FIG. 1, the method includes: S100 of providing a substrate.

In this step, a substrate is provided. According to an embodiment of the present disclosure, referring to FIG. 2, a pixel defining layer 200 is disposed on the substrate 100 and defines a plurality of sub-pixel regions 10 on the substrate 100 (see the three sub-pixel regions 10A, 10B, and 10C shown in FIG. 2). The plurality of sub-pixel regions 10 have different colors.

Hereinafter, embodiments according to the present disclosure are explained in details by taking a top-emission white OLED as an example.

A white OLED display device formed by a white OLED (organic light-emitting diode) in combination with a color filter includes an OLED display substrate and a cover plate disposed opposite to each other. The OLED display substrate adopts a white OLED, and the cover plate includes a color filter. The OLED display device adopts a top emission mode, the white light emitted by the OLED display substrate is emitted from the cathode and is then filtered by the color filter to obtain corresponding pixel colors, thereby achieving color display. According to an embodiment of the present disclosure, referring to FIG. 2, the substrate 100 is at the bottom of the white OLED (i.e., the OLED display substrate) (for example, the "bottom" shown in FIG. 2), the light emitted from the white OLED is emitted out in the "top" direction shown in FIG. 2. It should be particularly noted that the plurality of sub-pixel regions having different colors in the present disclosure denote that the colors provided by the plurality of sub-pixel regions are not completely same, or the colors of the filters of the color filter (not shown in figures) corresponding to the plurality of sub-pixel regions 10 are not completely same. It can be readily understood by those skilled in the art that in the white OLED display device formed by a white OLED in combination with the color filter, the light emitting layer of the white OLED emits uniform white light, and the light emitting layer in each of the sub-pixel regions (such as the sub-pixel regions 10 shown in FIG. 2) in the white OLED display device also emits white light, which is filtered by filters having different colors (for example, red green, and blue filters) of the color filter to present corresponding red, green and blue pixel colors, that is, regions corresponding to the respective sub-pixel regions 10 present different pixel colors on the entire OLED display panel, thereby achieving color display.

According to an embodiment of the present disclosure, specific material of the substrate 100 is not particularly limited, and those skilled in the art may select a substrate according to actual needs. For example, according to an embodiment of the present disclosure, the substrate 100 may be a glass substrate. According to an embodiment of the present disclosure, specific material and manner for forming the pixel defining layer 200 are not particularly limited. For example, the pixel defining layer 200 may be directly formed on the substrate 100, the pixel defining layer 200 may define a plurality of openings arranged in an array on the substrate 100, and a plurality of sub-pixel regions 10 may be formed on the substrate 100 using the openings. According to an embodiment of the present disclosure, the method for forming the pixel defining layer 200 is not particularly limited. For example, a layer of pixel defining layer material may be coated on the substrate 100 by spin coating, and then undergoes pre-baking, exposing, developing, and post-baking, etc., to obtain the pixel defining layer 200. In an embodiment, the pixel defining layer 200 may have a thickness of about 2.0 μm.

According to an embodiment of the present disclosure, the colors corresponding to the plurality of sub-pixel regions are not completely same. For example, referring to FIG. 2, the sub-pixel region 10A may correspond to the green pixel (G), the sub-pixel region 10B may correspond to the blue pixel (B), and the sub-pixel region 10C may correspond to the red pixel (R).

Figure 3:
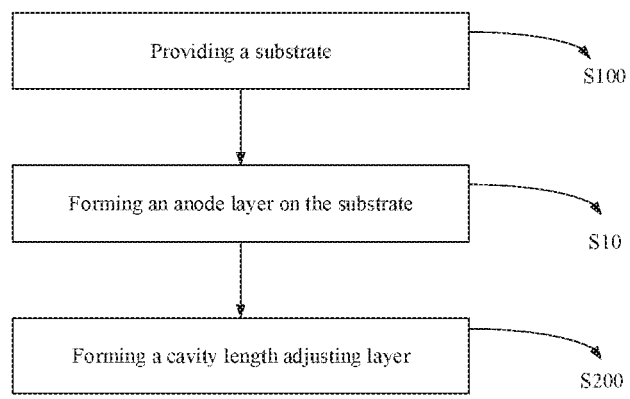
FIG. 3 is a flow chart of a method for fabricating an OLED display substrate according to another embodiment of the present disclosure.

According to an embodiment of the present disclosure, referring to FIG. 3, the method may further include: S10 of forming an anode layer on the substrate.

Figure 4:
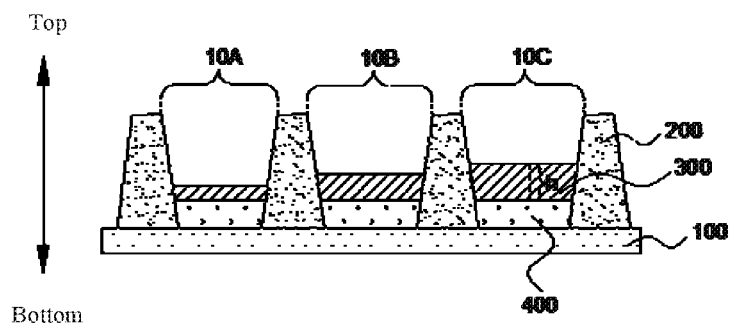
FIG. 4 is a partial structural diagram of an OLED display substrate according to another embodiment of the present disclosure.

In this step, an anode layer is formed on the substrate. According to an embodiment of the present disclosure, the order in which the anode layer is formed is not particularly limited. For example, according to some embodiments of the present disclosure, the pixel defining layer may be first formed on the substrate and defines a plurality of sub-pixels on the substrate, the anode layer is then disposed in the plurality of sub-pixel regions. According to some other embodiments of the present disclosure, the anode layer may also be first disposed on the substrate and then the pixel defining layer is disposed. In an embodiment, referring to FIG. 4, an anode layer 400 may be formed on the substrate 100 and in the sub-pixel regions 10. Taking atop-emission OLED display substrate as an example, the anode layer 400 includes a reflective anode layer in addition to a conductive anode layer, and the reflective anode layer is disposed on the conductive anode layer (not shown in figures). Thus, the light emitted from the light emitting layer can be reflected by the reflective anode layer and emitted only from the top of the OLED display substrate. In an embodiment, the specific material of the conductive anode layer is not particularly limited, and may be, for example, indium tin oxide (ITO), indium zinc oxide (IZO), or the like. In an embodiment, the material of the reflective anode layer is also not particularly limited as long as it is electrically conductive and can reflect light, and may be for example, Ag. According to an embodiment of the present disclosure, the anode layer 400 may include a conductive anode layer (ITO layer) and a reflective anode layer (Ag layer) which are provided in a stacked manner, and thus the anode layer 400 has both conductive and reflective functions. According to an embodiment of the present disclosure, a conductive anode layer (ITO layer) and a reflective anode layer (Ag layer) may be sequentially deposited on the substrate by sputtering. In an embodiment, the conductive anode layer (ITO layer) may have a thickness of about 80 Å, and the reflective anode layer (Ag layer) may have a thickness of about 1000 Å. The ITO/Ag layer does not require patterning and no additional etching process is required.

The method further includes: S200 of forming a cavity length adjusting layers.

Figure 2:
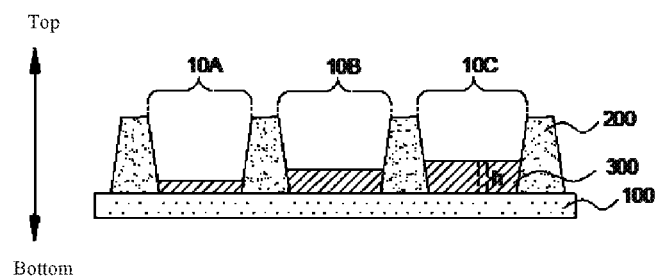
FIG. 2 is a partial structural diagram of an OLED display substrate according to an embodiment of the present disclosure.

In this step, a conductive ink is applied by printing in the plurality of sub-pixel regions described above to form cavity length adjusting layers, and the cavity length adjusting layers have different thicknesses in the sub-pixel regions having different colors. As described above, the inventors have found that the cavity length of the optical resonant cavity greatly affects the wavelength and wavelength range of the emitted light, and in the OLED display substrate for color display, it is usually required to design different cavity lengths for sub-pixel regions having different colors in order to improve the color purity of the sub-pixel regions having different colors. For example, in sub-pixel regions having different colors, the ink may be applied to have different thicknesses by printing. Thus, the cavity length of the optical resonant cavity can be better adjusted, and the color purity of each sub-pixel region can be greatly improved, which is advantageous for achieving a high color gamut and improving display quality of the OLED display substrate. Moreover, inkjet printing is simple in operation, and is easy to control the thickness h of the cavity length adjusting layer 300 formed by printing (as shown in FIG. 2), for example, by controlling the sprinkling amount of ink to be printed, the thickness of the formed cavity length adjusting layer 300 can be controlled, thereby saving production cost and production steps.

According to an embodiment of the present disclosure, the material of the conductive ink is not particularly limited as long as it has good conductivity and can easily form a cavity length adjusting layer having good reflectivity by inkjet printing. In an embodiment, the cavity length adjusting layer may be made of a material including at least one of a metal nanoparticle (for example, nano-silver, nano-gold, nano-copper, etc.), a conductive carbon material, and a conductive polymer. Thus, the material for forming the cavity length adjusting layer comes from a wide range of sources and is readily available. The material has good electrical conductivity and reflective properties, further improving the use performance of the OLED display substrate.

Since the cavity length adjusting layer according to the embodiments of the present disclosure is applied by printing, and does not involve ITO material or a process of controlling the thickness of the cavity length adjusting layer by etching, the problem that when the thickness of the cavity length adjusting layer exceeds a certain range, the material of the cavity length adjusting layer is easily crystallized to cause incomplete etching and residue can be avoided. Thus, for the cavity length adjusting layer according to an embodiment of the present disclosure, the thickness of the cavity length adjusting layer maybe designed based on the requirements on the cavity length of the sub-pixel regions having different colors without considering restraint of the material of the cavity length adjusting layer. Thus, the range of the cavity length of the microcavity structure can be further widened, so that it can be applied to various color combination schemes. According to the embodiments of the present disclosure, the cavity length adjusting layers having different thicknesses can be conveniently formed in the sub-pixel regions having different colors, the operation is easy, production steps are saved, and yield rate is improved. The thickness of the formed cavity length adjusting layer is controllable and uniform, resulting in that the cavity length of the optical resonant cavity can be readily adjusted, which can improve the color purity of the OLED and display quality of the OLED display substrate.

Hereinafter, the thicknesses of the cavity length adjusting layers according to an embodiment of the present disclosure will be described in detail by taking a RGB scheme as an example. For example, referring to FIG. 2, the sub-pixel region 10A may correspond to green (i.e., the pixel color of the sub-pixel 10A is green, in other words, the sub-pixel 10A is a green sub-pixel region), the sub-pixel region 10B may correspond to blue, and the sub-pixel region 10C may correspond to red. Since red has a relatively long absorption wavelength, the thickness of the cavity length adjusting layer 300 in the sub-pixel region 10C is relatively large.

According to an embodiment of the present disclosure, the cavity length adjusting layer in the red sub-pixel region may have a thickness of 1630 Å to 1730 Å, for example, 1665 Å, 1680 Å, or 1720 Å. The cavity length adjusting layer in the green sub-pixel region has a thickness of 730 Å-830 Å, for example, 765 Å, 780 Å, or 810 Å. The cavity length adjusting layer in the blue sub-pixel region has a thickness of 1130 Å to 1230 Å, for example, 1155 Å, 1180 Å, or 1210 Å. The inventors have found through in-depth research and a large number of experiments that when the thicknesses of the cavity length adjusting layers in the red, green, and blue sub-pixel regions are within the above range, the cavity lengths of the microcavity structures can be well adjusted, and thus the color purity of the white light emitted from OLED in each sub-pixel region is improved, which is advantageous for achieving a high color gamut and improving the display quality of the OLED display substrate.

The OLED display substrate obtained according to the method of the embodiments of the present disclosure can also be applied to an OLED display device in which a light emitting layer emits monochromatic light. When all of the light emitting layers in the plurality of sub-pixel regions emit monochromatic light (such as red light, green light, or blue light), the cavity length adjusting layer may also be utilized to form microcavity structures having different cavity lengths for the sub-pixels having different colors, which improves the purity of the emitted light. In an embodiment, the sub-pixel region corresponding to the color having a longer absorption wavelength has a thicker cavity length adjusting layer. As described above, the cavity length of the optical resonant cavity corresponding to a certain pixel color may match with the wavelength of the pixel color, that is, the thickness of the cavity length adjusting layer corresponding to a certain pixel color may match with the absorption wavelength of the pixel color. Therefore, each cavity length adjusting layers can be designed to have a reasonable thickness based on the absorption wavelength of the color corresponding to the sub-pixel region, that is, the sub-pixel region corresponding to the color having a longer absorption wavelength has a cavity length adjusting layer having a larger thickness. As a result, the color purity can be improved for different light emitting layers, and the light-emitting quality of the OLED display substrate can also be improved.

Figure 5:
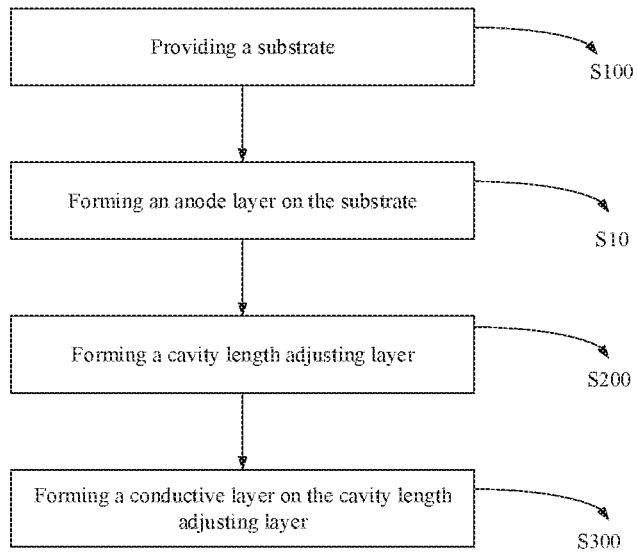
FIG. 5 is a flow chart of a method for fabricating an OLED display substrate according to still another embodiment of the present disclosure.

According to an embodiment of the present disclosure, referring to FIG. 5, the method may further include: S300 of forming a conductive layer on the cavity length adjusting layer.

In this step, a conductive layer is formed on the cavity length adjusting layer. According to an embodiment of the present disclosure, referring to FIG. 6, a conductive layer 500 is formed on the cavity length adjusting layer 300. The conductive layer 500 can improve the work function of the anode and hole transport efficiency, and thereby improve luminous efficiency of the OLED display substrate. According to an embodiment of the present disclosure, a method for forming the conductive layer on the cavity length adjusting layer is not particularly limited, for example, a deposition method or the like maybe employed. According to an embodiment of the present disclosure, the material for forming the conductive layer 500 is not particularly limited, and may include, for example, at least one of indium tin oxide and indium zinc oxide. These materials have excellent hole injection ability and light transmissivity, which further improves the luminous efficiency of the OLED display substrate. According to an embodiment of the present disclosure, the conductive layer may have a thickness of 1100 Å-1300 Å, for example, 1200 Å. Thus, when the thickness of the conductive layer 500 is within this range, the hole transport efficiency can be improved, so the illuminous efficiency of the OLED display substrate can be further improved. In the method according to the embodiments of the present disclosure, the conductive material (such as ITO) deposited in this step is not required to function to adjust the cavity length, so it is just required to deposit an ITO layer having a uniform thickness in each sub-pixel region, and then perform a simple etching process for patterning. The operation process is relatively simple, which further simplifies the production process and improves the yield. Moreover, since the conductive layer does not necessarily function to adjust the cavity length, it does not involve subsequent adjustment of the thicknesses of the conductive layers in different color sub-pixel regions by using an etching process. Thus, when designing the thickness of the conductive layer, only the electrical performance of the device (OLED) needs to be considered without considering requirements of the etching process (such as etching accuracy) for the thickness of the conductive material.

According to an embodiment of the present disclosure, the conductive layer 500 may be formed by depositing a conductive layer (ITO layer) on the cavity length adjusting layer by sputtering, then applying a layer of photoresist material by spin coating, and subsequently patterning the ITO layer through processes such as pre-baking, exposing, developing, and wet etching to obtain the conductive layer 500 according to the embodiment of the present disclosure.

Figure 7:
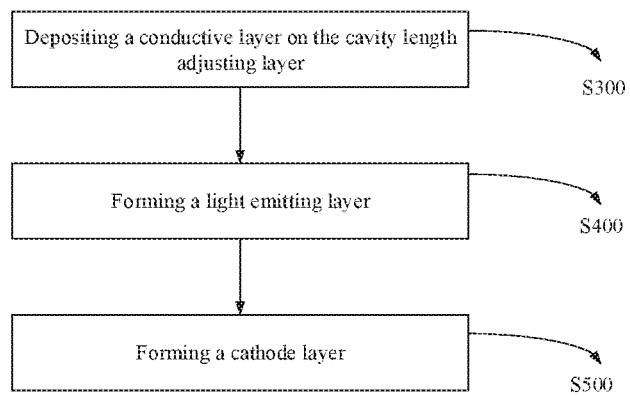
FIG. 7 is a flow chart of a method for fabricating an OLED display substrate according to another embodiment of the present disclosure.

According to an embodiment of the present disclosure, referring to FIG. 7, the method may further include: S40) of forming a light emitting layer.

In this step, a light emitting layer is formed on a side of the conductive layer away from the cavity length adjusting layer. According to an embodiment of the present disclosure, referring to FIG. 8, the light emitting layer 600 is formed on a side of the conductive layer 500 away from the cavity length adjusting layer 300. In an embodiment, the light emitting layer may be formed by an evaporation method. In an embodiment, the material for forming the light emitting layer may be a luminescent material emitting white light, for example, a conventional luminescent material emitting white light in the art. Alternatively, the light emitting layer may emit monochromatic light, for example, a luminescent material emitting red light, a luminescent material emitting green light, a luminescent material emitting blue light, and the like, may be formed in different sub-pixel regions, respectively.

The method may further include: S500 of forming a cathode layer.

In this step, a cathode layer is formed on a side of the light emitting layer away from the conductive layer, so as to form an OLED display substrate. According to an embodiment of the present disclosure, referring to FIG. 8, the cathode layer 700 is formed on a side of the light emitting layer 600 away from the conductive layer 500 to thereby form the OLED display substrate 1100. In an embodiment, the cathode layer may be formed by sputtering. In an embodiment, the material for forming the cathode layer is not particularly limited as long as it has good conductivity and light transmittance, and a small work function.

Figure 8:
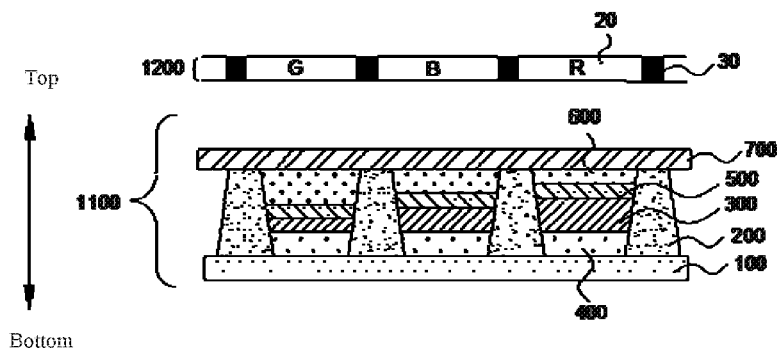
FIG. 8 is a partial structural diagram of an OLED display substrate according to another embodiment of the present disclosure.

It is noted that FIG. 8 is simply a schematic diagram according to one embodiment of the present disclosure. The thickness of the light emitting layer 600 maybe appropriately adjusted as needed, for example, based on the thickness of the cavity length adjusting layer 300 such that the sum of the thicknesses of the cavity length adjusting layer 300, the conductive layer 500, and the light emitting layer 600 in each sub-pixel region is the same. The thickness of the light emitting layer 600 may also be set as needed, referring to FIG. 9, the thickness of the light emitting layer 600 in each sub-pixel region may be the same, or the light emitting layer may be set to have different thickness based on the luminescent materials.

In another aspect of the present disclosure, an OLED display substrate is provided. According to an embodiment of the present disclosure, the OLED display substrate may be fabricated by the method for fabricating an OLED display substrate described above, thus have all the features and advantages of the OLED display substrate obtained by the method described above, and details are not described herein again. According to an embodiment of the present disclosure, referring to FIG. 2, the OLED display substrate includes a substrate 100, a pixel defining layer 200, and cavity length adjusting layers 300. The pixel defining layer 200 is disposed on the substrate 100, and defines a plurality of sub-pixel regions 10 having different colors; the cavity length adjusting layers 300 are formed in the sub-pixel regions 10. The cavity length adjusting layers 300 in sub-pixel regions 10 having different colors have different thicknesses. Thus, the cavity length adjusting layers 300 having different thicknesses can flexibly adjust the cavity lengths of microcavities in the sub-pixel regions 10 having different colors, resulting in improved color purity of the white OLED in each sub-pixel region, and improved display quality of the OLED display substrate.

According to an embodiment of the present disclosure, the plurality of sub-pixel regions 10 may include a red sub-pixel region, a green sub-pixel region, and a blue sub-pixel region. According to an embodiment of the present disclosure, the thickness of the cavity length adjusting layer of the red sub-pixel region may be in the range of 1630 Å to 1730 Å, and may be, for example, 1665 Å, 1680 Å, or 1720 Å. The thickness of the cavity length adjusting layer of the green sub-pixel region may be in the range of 730 Å to 830 Å, and may be, for example, 765 Å, 780 Å, or 810 Å. The thickness of the cavity length adjusting layer of the blue sub-pixel region may be in the range of 1130 Å to 1230 Å, and may be, for example, 1155 Å, 1180 Å, or 1210 Å. Thus, when the thicknesses of the cavity length adjusting layers in the red, green, and blue sub-pixel regions are respectively within the above ranges, the cavity lengths of the microcavity structures can be well adjusted, which in turn can improve the color purity of the white OLED in each sub-pixel region and is favorable for achieving a high color gamut and improving the display quality of the OLED display substrate.

Figure 6:
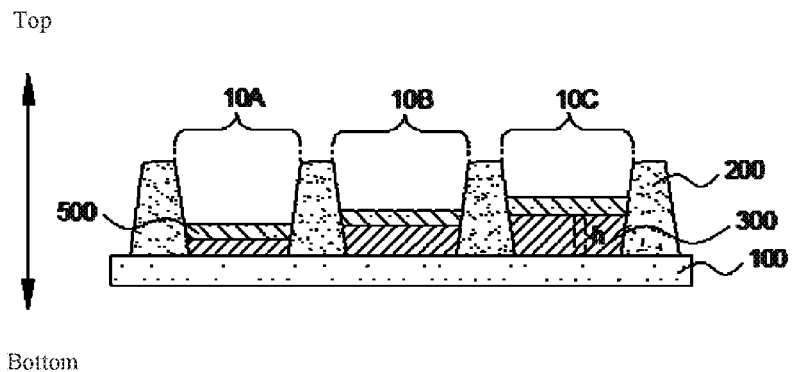
FIG. 6 is a partial structural diagram of an OLED display substrate according to still another embodiment of the present disclosure.

According to an embodiment of the present disclosure, referring to FIG. 6, the OLED display substrate may further include: a conductive layer 500 disposed on a side of the cavity length adjusting layer 300 away from the substrate 100. Thus, the conductive layer 500 can improve the work function of the anode and the hole transport efficiency, and further improve the luminous efficiency of the OLED display substrate. According to an embodiment of the present disclosure, the material for forming the conductive layer 500 is not particularly limited, and may include, for example, at least one of indium tin oxide and indium zinc oxide. The materials have excellent hole injection ability and light transmissivity, and further improves the luminous efficiency of the OLED display substrate. According to an embodiment of the present disclosure, the conductive layer may have a thickness of 1100 Å to 1300 Å, for example, 1200 Å. When the thickness of the conductive layer 500 is within this range, the hole transport efficiency can be improved, and the luminous efficiency of the OLED display substrate can be further improved.

Figure 10:
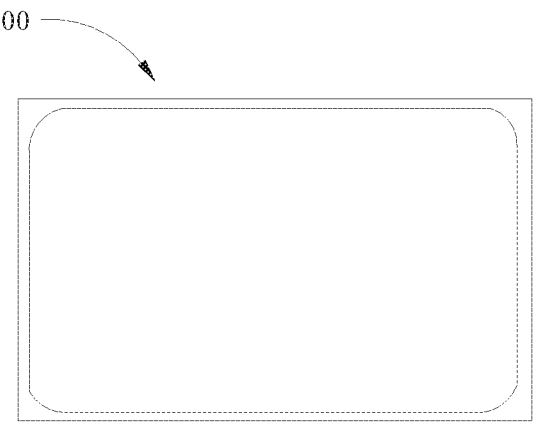
FIG. 10 is a schematic structural diagram of an OLED display device according to an embodiment of the present disclosure.

In still another aspect of the present disclosure, an OLED display device is provided. According to an embodiment of the present disclosure, referring to FIG. 10, the display device 1000 includes the OLED display substrate described above or the OLED display substrate fabricated by the method described above. Therefore, the OLED display device has all the features and advantages of the OLED display substrate described above, and details are not described herein again. In general, the OLED display device has higher color purity and better display performance.

Figure 9:
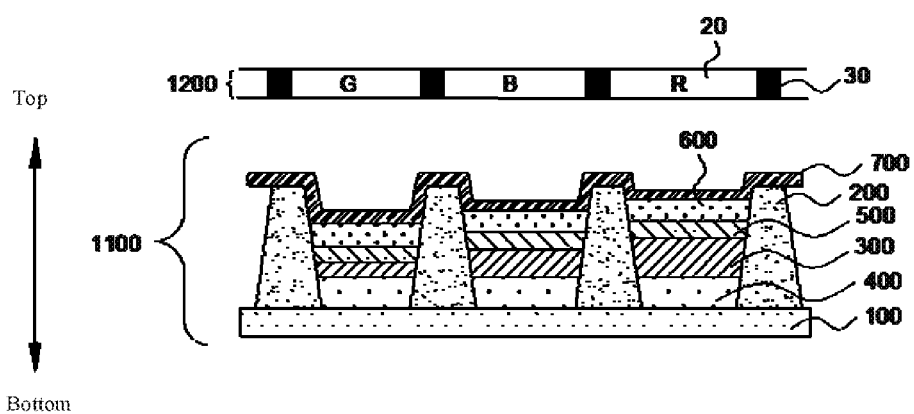
FIG. 9 is a partial structural diagram of an OLED display substrate according to another embodiment of the present disclosure.

According to an embodiment of the present disclosure, referring to FIG. 8 and FIG. 9, the OLED display device 1000 further includes a cover plate 1200, which may include a color filter 20, a black matrix 30, and the like. Referring to FIG. 9, the cover plate 1200 and the OLED display substrate 1100 are disposed opposite to each other. The black matrix 30 is disposed opposite to the pixel defining layer 200 (an orthographic projection of the black matrix 20 on the substrate 100 overlaps with an orthographic projection of the pixel defining layer 200 on the substrate 100). The color filter 20 (R, G, and B as shown in the figures) corresponds to the areas where the sub-pixel units are located. In this way, the white light emitted from the top surface of the OLED display substrate 1100 is filtered by the filters having different colors of the color filter 20, and then turns into colored light, thereby achieving color display. It should be noted that the colors (red R, green G, and blue B as shown in the figures) of the color filter 20 shown in FIG. 8 and FIG. 9 are only one example of the present disclosure, the specific colors are not particularly limited and may be designed by those skilled in the art according to an actual color combination scheme.

Figure 11:
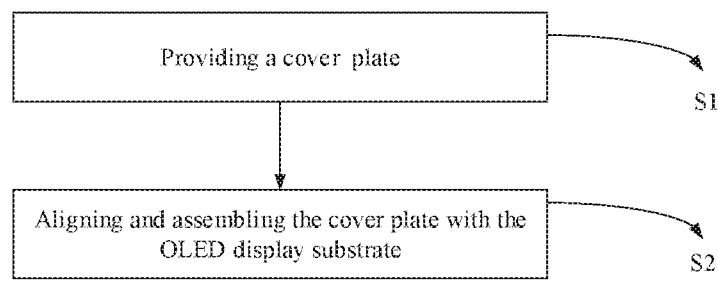
FIG. 11 is a flow chart of a method for fabricating an OLED display device according to an embodiment of the present disclosure.

According to an embodiment of the present disclosure, the cover plate 1200 may further include a black matrix (BM layer), a color filter (i.e., a CF layer), a planarization layer, an auxiliary metal cathode layer, a spacer layer (for example, a PS layer) and a contact electrode layer sequentially stacked. In an embodiment, referring to FIG. 11, the OLED display device may be fabricated using the method including the following steps.

S1 includes: providing a cover plate.

In this step, a cover plate is provided. In an embodiment, the cover plate may be fabricated by the following method including:

(1) providing a cover plate substrate, cleaning the cover plate substrate by using a standard method, and preparing the BM layer;

(2) coating a filter film material by slit coating, and performing pre-baking, exposing, developing, post-baking, etc., to pattern the coated filter film material to form a CF layer; in an embodiment, the formed CF layer has a thickness of about 2.0 μm;

(3) coating a planarization layer material by spin coating, and performing pre-baking, exposing, developing, post-baking, etc., to pattern the coated planarization layer material to form a planarization layer; in an embodiment, the planarization layer has a thickness of about 2.5 microns;

(4) depositing a first Mo layer, a AlNd layer and a second Mo layer sequentially using a sputtering device, the deposited first Mo layer, the AlNd layer and the second Mo layer having thicknesses of about 400 Å, 3000 Å, and 800 Å, respectively, then applying a photoresist for patterning the deposited first Mo layer, the AlNd layer and the second Mo layer, and subsequently performing wet etching, stripping the photoresist off, etc. to form an auxiliary cathode layer;

(5) coating a rigid spacer material, such as polystyrene (PS), by spin coating, and performing pre-baking, exposure, development, post-baking, etc., to pattern the coated rigid spacer material to form a rigid spacer layer, the formed spacer layer having a thickness between 3.5 and 4.5 microns; and (6) depositing ITO using a sputtering device, and then applying a photoresist for patterning, and subsequently performing wet etching, stripping the photoresist off, etc. to form a contact electrode layer; in an embodiment, the contact electrode layer has a thickness of about 1350 Å.

S2 includes: aligning and assembling the cover plate with the OLED display substrate.

In this step, the OLED display substrate described above and the cover plate fabricated by the foregoing method are aligned and assembled, so that an OLED display device according to an embodiment of the present disclosure is obtained.

The present disclosure uses printing techniques to apply nano-silver inks having different thicknesses in pixel regions having different colors, and then deposits ITO material having the uniform thickness to form a cavity length adjusting layer having different length. The disclosure can easily form a cavity length adjusting layer with controllable thickness, and the light emitted by the microcavity structure can be directed intensively, which can greatly improve the color purity of the OLED and meet the requirements of high color gamut.

In the description of the present disclosure, the terms "on", "below", "top", "bottom" and the like denote the orientation or position relationship based on the drawings, and is merely for convenience of description of the present disclosure. The present disclosure is not to be construed as being limited to the details.

In the description of the present specification, the terms "one embodiment", "another embodiment" or the like means that the specific features, structures, materials or characteristics described in connection with the embodiments are included in at least one embodiment of the present disclosure. In the present specification, the schematic expression of the above terms is not necessarily directed to the same embodiment or example. Furthermore, the particular features, structures, materials, or characteristics described may be combined in a suitable manner in any one or more embodiments or examples. In addition, one skilled in the art may combine or regroup various embodiments or examples described in the specification or the features of various embodiments or examples without contradiction.

While the embodiments of the present disclosure have been shown and described above, it could be understood that the foregoing embodiments are illustrative and are not to be construed as limiting the scope of the disclosure. Those skilled in the art may make variations, modifications, substitutions and changes within the scope of the disclosure.

What is claimed is:

1. An organic light-emitting diode (OLED) display substrate, comprising:
    a substrate;
    a pixel defining layer on the substrate, for defining a plurality of sub-pixel regions having different colors;
    cavity length adjusting layers in the plurality of sub-pixel regions, wherein the cavity length adjusting layers are formed of a conductive ink, and in the plurality of sub-pixel regions having different colors, the thicknesses of the cavity length adjusting layers are different;
    a conductive layer on a side of the cavity length adjusting layer away from the substrate, wherein the conductive layer comprises indium tin oxide or indium zinc oxide; and
    a light emitting layer on a side of the conductive layer away from the cavity length adjusting layer,
    wherein the plurality of sub-pixel regions comprise a red sub-pixel region, a green sub-pixel region, and a blue sub-pixel region, the cavity length adjusting layer in the red sub-pixel region has a thickness of about 1630 Å to 1730 Å, the cavity length adjusting layer in the green sub-pixel region has a thickness of about 730 Å to 830 Å, and the cavity length adjusting layer of the blue sub-pixel region has a thickness of about 1130 Å to 1230 Å.

2. The OLED display substrate according to claim 1, wherein the conductive ink comprises at least one of a metal nanoparticle, a conductive carbon material and a conductive polymer.

3. The OLED display substrate according to claim 1, wherein the conductive ink is nano-silver ink, and the thicknesses of the cavity length adjusting layers in the red sub-pixel region, the green sub-pixel region, and the blue sub-pixel regions are about 1680 Å, 780 Å, and 1180 Å, respectively.

4. The OLED display substrate according to claim 3, further comprising:
    an anode layer on the substrate and in the plurality of sub-pixel regions, wherein the cavity length adjusting layers are on a side of the anode layer away from the substrate.

5. The OLED display substrate according to claim 4, wherein the anode layer comprises a conductive anode layer and a reflective anode layer, the conductive anode layer comprises indium tin oxide or indium zinc oxide and has a thickness of about 80 Å, and the reflective anode layer comprises silver and has a thickness of about 1000 Å.

6. The OLED display substrate according to claim 5, wherein the conductive layer has a thickness of about 1100 Å to 1300 Å.

7. The OLED display substrate according to claim 6, further comprising:
    a cathode layer on a side of the light emitting layer away from the conductive layer.

8. An OLED display device comprising an OLED display substrate, the OLED display substrate being the OLED display substrate according to claim 1.

9. The OLED display device according to claim 8, further comprising:
    a cover plate having a color filter and a black matrix, wherein the cover plate is opposite to the OLED display substrate, the black matrix is opposite to the pixel defining layer, and the color filter is opposite to the sub-pixel regions.

10. A method for fabricating an OLED display substrate, comprising:
    providing a substrate on which a pixel defining layer is disposed, the pixel defining layer defining a plurality of sub-pixel regions having different colors;
    applying a conductive ink in the plurality of sub-pixel regions to form cavity length adjusting layers, wherein, in the plurality of sub-pixel regions having different colors, the thicknesses of the cavity length adjusting layers are different;
    forming a conductive layer on the cavity length adjusting layers, wherein the conductive layer comprises indium tin oxide or indium zinc oxide; and
    forming a light emitting layer on a side of the conductive layer away from the cavity length adjusting layers by evaporation,
    wherein the plurality of sub-pixel regions comprise a red sub-pixel region, a green sub-pixel region, and a blue sub-pixel region, the cavity length adjusting layer in the red sub-pixel region has a thickness of about 1630 Å to 1730 Å, the cavity length adjusting layer in the green sub-pixel region has a thickness of about 730 Å to 830 Å, and the cavity length adjusting layer of the blue sub-pixel region has a thickness of about 1130 Å to 1230 Å.

11. The method according to claim 10, wherein the step of applying a conductive ink in the plurality of sub-pixel regions comprises applying the conductive ink by printing in the plurality of sub-pixel regions.

12. The method according to claim 11, wherein the conductive ink comprises at least one of a metal nanoparticle, a conductive carbon material and a conductive polymer.

13. The method according to claim 10, wherein the conductive ink is a nano silver ink, and the thicknesses of the cavity length adjusting layers in the red sub-pixel region, the green sub-pixel region, and the blue sub-pixel region are about 1680 Å, 780 Å, and 1180 Å, respectively.

14. The method according to claim 13, before the step of applying the conductive ink by printing in the plurality of sub-pixel regions, further comprising:
   forming an anode layer in the plurality of sub-pixel regions by sputtering, wherein the cavity length adjusting layers are disposed on a side of the anode layer away from the substrate.

15. The method according to claim 14, wherein the anode layer comprises a conductive anode layer and a reflective anode layer formed in sequence, the conductive anode layer comprises indium tin oxide or indium zinc oxide and has a thickness of about 80 Å, and the reflective anode layer comprises silver and has a thickness of about 1000 Å.

16. The method according to claim 15, wherein the conductive layer has an uniform thickness in the plurality of sub-pixel regions, the thickness of the conductive layer being about 1100 Å to 1300 Å.

17. The method according to claim 16, further comprising:
   forming a cathode layer on a side of the light emitting layer away from the conductive layer by sputtering.

* * * * *